United States Patent
Wang

(10) Patent No.: US 10,715,203 B2
(45) Date of Patent: Jul. 14, 2020

(54) WIRELESS TRANSCEIVER CAPABLE OF OFFSETTING INTERNAL SIGNAL LEAKAGE

(71) Applicant: REALTEK SEMICONDUCTOR CORPORATION, Hsinchu (TW)

(72) Inventor: Chih-Chieh Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/443,116

(22) Filed: Jun. 17, 2019

(65) Prior Publication Data

US 2020/0044684 A1 Feb. 6, 2020

(30) Foreign Application Priority Data

Aug. 6, 2018 (TW) ............................ 107127215 A

(51) Int. Cl.
*H04B 1/525* (2015.01)
*H04L 5/14* (2006.01)
(Continued)

(52) U.S. Cl.
CPC ............ *H04B 1/525* (2013.01); *H04B 1/0475* (2013.01); *H04B 17/0085* (2013.01);
(Continued)

(58) Field of Classification Search
CPC ...... H04B 1/525; H04B 1/0475; H04B 17/11; H04B 17/0085; H04B 17/364;
(Continued)

(56) References Cited

U.S. PATENT DOCUMENTS

| | | | | |
|---|---|---|---|---|
| 5,524,281 A | * | 6/1996 | Bradley | ............... G01R 27/28 324/601 |
| 5,999,008 A | * | 12/1999 | Currin | ............. G01R 31/31924 324/762.03 |
| 2014/0194073 A1 | | 7/2014 | Wyville et al. | |

FOREIGN PATENT DOCUMENTS

CN 107863988 A 3/2018
EP 3300259 A1 3/2018

OTHER PUBLICATIONS

Mahmoud Abdelaziz et al., "Digital Predistortion for Mitigating Transmitter-Induced Receiver Desensitization in Carrier Aggregation FDD Transceivers", 2016, pp. 694-698, IEEE.

(Continued)

*Primary Examiner* — Fitwi Y Hailegiorgis
(74) *Attorney, Agent, or Firm* — WPAT, PC

(57) ABSTRACT

The present invention discloses a wireless transceiver capable of offsetting internal signal leakage. The wireless transceiver includes a transmission circuit, a reception circuit and a calibration circuit. The calibration circuit generates a first estimation signal according to the difference between a test signal and a reception digital signal passing through a standard path, generates a second estimation signal according to the difference between the test signal and a reception digital signal passing through a leakage path, and then determines N coefficient(s) of a calibration filter according to the difference between the first estimation signal and the second estimation signal. Therefore, the calibration circuit including the calibration filter can output a calibration signal to the reception circuit to offset at least a part of the signal leakage from the transmission circuit to the reception circuit.

18 Claims, 2 Drawing Sheets

(51) Int. Cl.
   *H04B 17/364*   (2015.01)
   *H04B 17/00*   (2015.01)
   *H04B 17/11*   (2015.01)
   *H04B 1/04*   (2006.01)
   *H03F 3/20*   (2006.01)

(52) U.S. Cl.
   CPC ........... *H04B 17/11* (2015.01); *H04B 17/364* (2015.01); *H04L 5/14* (2013.01); *H03F 3/20* (2013.01); *H03F 2200/294* (2013.01); *H03F 2200/451* (2013.01); *H04B 2001/0408* (2013.01)

(58) Field of Classification Search
   CPC ... H04B 2001/0408; H04B 17/14; H04L 5/14; H03F 2200/294; H03F 3/20; H03F 2200/451; H03F 3/189; H03F 3/24
   USPC .............................. 375/219; 324/601, 762.03
   See application file for complete search history.

(56)            References Cited

OTHER PUBLICATIONS

OA letter of counterpart TW application of application No. 107127215 mailed on May 15, 2019. Summary of the OA letter: Claims 1-10 are rejected as being unpatentable over the cited reference 1 (CN 107863988 A, also published as EP3300259A1) and cited reference 2 (US 2014/0194073 A1).

* cited by examiner

WIRELESS TRANSCEIVER CAPABLE OF OFFSETTING INTERNAL SIGNAL LEAKAGE

BACKGROUND OF THE INVENTION

1. Field of the Invention

The present invention relates to a wireless transceiver, especially to a wireless transceiver capable of offsetting internal signal leakage.

2. Description of Related Art

Regarding a wireless communication system chip, if a transceiver requires high transmission power to achieve good signal quality, the transceiver usually uses an external power amplifier to amplify a transmission signal and uses a digital predistortion (DPD) compensation circuit to compensate for the non-linearity of the transmission signal. In a circumstance that a transmission circuit and a reception circuit of the above-mentioned transceiver operate simultaneously (e.g., in a frequency-division duplexing mode), if the transceiver wants to estimate filter coefficients of the DPD compensation circuit in a cost-effective manner, the transceiver may use the existing reception circuit to obtain a reception signal induced by the coupling of a transmission signal passing through the transmission circuit with the influence of non-linearity and then estimate the filter coefficients of the DPD compensation circuit according to the reception signal. A related art is found in the following literature: Mahmoud Abdelaziz, Lauri Anttila, and Mikko Valkama, "DIGITAL PREDISTORTION FOR MITIGATING TRANSMITTER-INDUCED RECEIVER DESENSITIZATION IN CARRIER AGGREGATION FDD TRANSCEIVERS", 2016 IEEE Global Conference on Signal and Information Processing (GlobalSIP).

However, when the reception circuit receives the reception signal induced by the coupling of the transmission signal, the reception circuit also receives the signal leakage of each amplifier of the transmission circuit and the signal leakage of the package pin(s) of the transmission circuit. These signal leakages between internal circuits will affect the reception signal received by the reception circuit, which leads to the inaccurate estimation of the filter coefficients of the DPD compensation circuit and degrades the performance of the DPD compensation circuit compensating for non-linearity.

SUMMARY OF THE INVENTION

An object of the present invention is to provide a wireless transceiver capable of offsetting internal signal leakage for preventing the problems of the prior art.

An embodiment of the wireless transceiver of the present invention includes a transmission circuit, a reception circuit, and a calibration circuit. The transmission circuit includes a transmission front-end circuit and a transmission back-end circuit. The transmission front-end circuit includes a digital-to-analog converter configured to generate a transmission analog signal according to a transmission digital signal. The transmission back-end circuit includes a transmission radio frequency circuit configured to generate a radio frequency transmission signal according to the transmission analog signal. The reception circuit includes a reception front-end circuit and a reception back-end circuit. The reception front-end circuit includes a reception radio frequency circuit configured to generate a reception analog signal according to the radio frequency transmission signal in a first mode and a second mode and configured to generate the reception analog signal according to a reception signal and a transmission signal in an operation mode, in which the reception analog signal includes signal leakage from the transmission radio frequency circuit and the transmission signal is the radio frequency transmission signal or the amplified signal thereof. The reception back-end circuit includes an analog-to-digital converter configured to generate a reception digital signal according to the reception analog signal. The calibration circuit includes a first connection path, a second connection path, a test signal generator, and a calibration signal generator. The first connection path is configured to be electrically conductive in the first mode and nonconductive in the second mode so as to connect the transmission front-end circuit and the reception back-end circuit in the first mode to form a standard path including the transmission front-end circuit, the first connection path, and the reception back-end circuit. The second connection path is configured to be electrically conductive in the second mode and nonconductive in the first mode so as to electrically connect the transmission back-end circuit and the reception front-end circuit in the second mode to form a leakage path including the transmission front-end circuit, the transmission back-end circuit, the second connection path, the reception front-end circuit, and the reception back-end circuit. The test signal generator is configured to output a test signal to the transmission front-end circuit in the first mode and the second mode to allow the transmission front-end circuit to generate the transmission analog signal according to the test signal in the first mode and the second mode. The estimation circuit is configured to carry out at least the following steps: generating a first estimation signal according to the difference between the test signal and the reception digital signal passing the standard path in the first mode; generating a second estimation signal according to the difference between the test signal and the reception digital signal passing the leakage path in the second mode; and determining N coefficient(s) of a calibration filter according to the difference between the first estimation signal and the second estimation signal, in which the N is a positive integer. The calibration signal generator includes the calibration filter and is configured to provide a calibration signal for the reception circuit in the operation mode to offset at least a part of the signal leakage from the transmission radio frequency circuit.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

Figure 1:
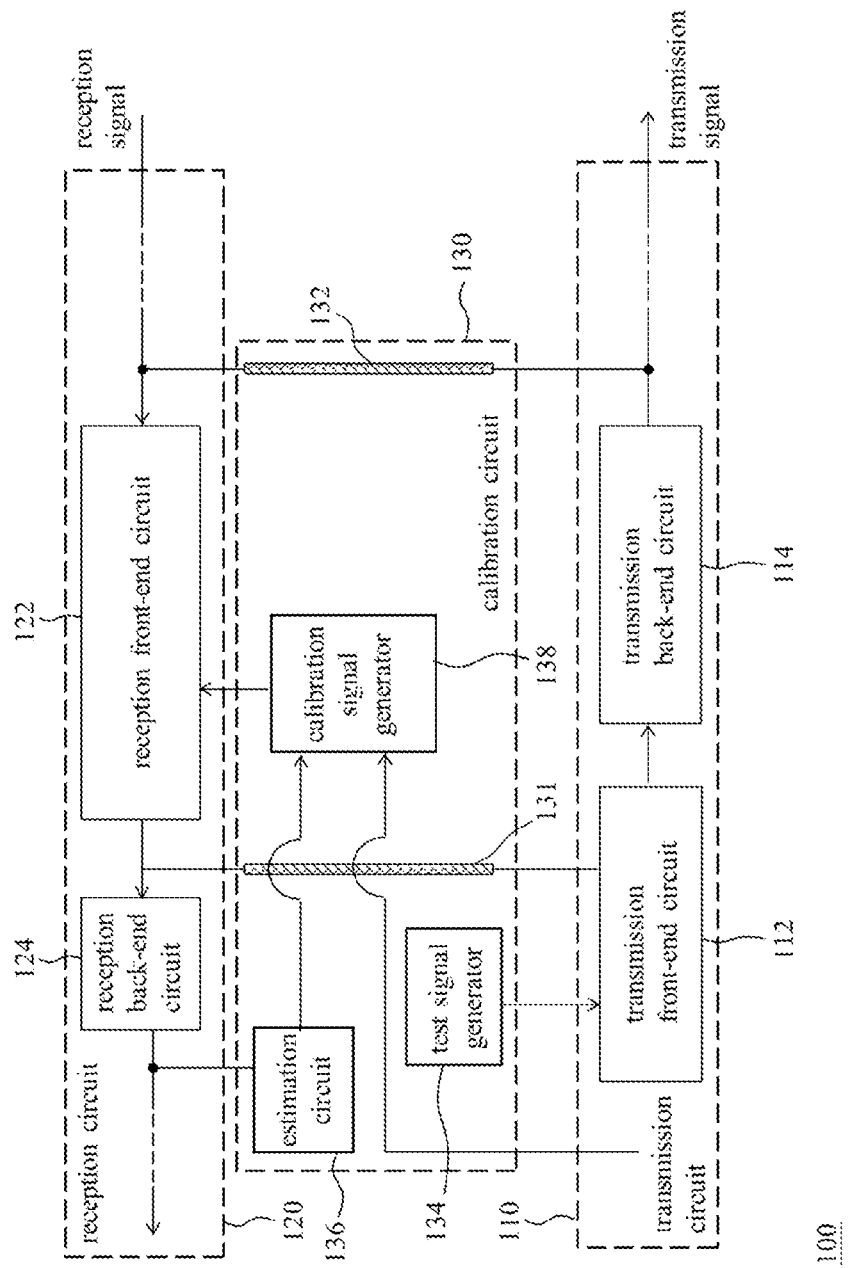
FIG. 1 shows an embodiment of the wireless transceiver of the present invention capable of offsetting internal signal leakage.

FIG. 1 shows an embodiment of the wireless transceiver of the present invention capable of offsetting internal signal leakage. The wireless transceiver 100 of FIG. 1 includes a transmission circuit 110, a reception circuit 120, and a calibration circuit 130. The transmission circuit 110 includes a transmission front-end circuit 112 and a transmission back-end circuit 114. The transmission front-end circuit 112 includes a digital-to-analog converter (DAC) (e.g., the DAC 212 of FIG. 2) configured to generate a transmission analog signal according to a transmission digital signal. The transmission back-end circuit 114 includes a transmission radio frequency circuit (e.g., the circuit of FIG. 2 including the transmission mixer 222, the preamplifier driver 224, and the power amplifier 226) configured to generate a radio frequency transmission signal according to the transmission analog signal. The reception circuit 120 includes a reception front-end circuit 122 and a reception back-end circuit 124. The reception front-end circuit 122 includes a reception radio frequency circuit (e.g., the circuit of FIG. 2 including the first low noise amplifier 232, the second low noise amplifier 234, the coupler 236, and the reception mixer 238) configured to generate a reception analog signal according to the radio frequency transmission signal in a first mode and a second mode; the reception radio frequency circuit is further configured to generate the reception analog signal according to a reception signal and a transmission signal in an operation mode, in which the reception analog signal includes signal leakage from the transmission radio frequency circuit and the transmission signal is the radio frequency transmission signal or the amplified signal thereof (e.g., the output signal of the external power amplifier 270 of FIG. 2). The reception back-end circuit 124 includes an analog-to-digital converter (ADC) (e.g., the ADC 242 of FIG. 2) configured to generate a reception digital signal according to the reception analog signal. It should be noted that each of the transmission circuit 110 and the reception circuit 120 is a known or self-developed circuit.

Please refer to FIG. 1. The calibration circuit 130 includes a first connection path 131, a second connection path, a test signal generator 134, an estimation circuit 136, and a calibration signal generator 138. The first connection path 131 is configured to be electrically conductive in the first mode and non-conductive in the second mode so that the first connection path 131 electrically connects the transmission front-end circuit 112 and the reception back-end circuit 124 in the first mode to form a standard path including the transmission front-end circuit 112, the first connection path 131, and the reception back-end circuit 124, in which the first connection path 131 may include at least one switch (e.g., transistor) or the equivalent thereof for realizing electrical connection and disconnection. The second connection path 132 is configured to be electrically conductive in the second mode and non-conductive in the first mode so that the second connection path 132 electrically connects the transmission back-end circuit 114 and the reception front-end circuit 122 in the second mode to form a leakage path including the transmission front-end circuit 112, the transmission back-end circuit 114, the second connection path 132, the reception front-end circuit 122, and the reception back-end circuit 124, in which the second connection path 132 may include at least one switch (e.g., transistor) or the equivalent thereof for realizing electrical connection and disconnection. The test signal generator 134 is configured to output a test signal (e.g., a signal composed of a plurality of single tone signals having different frequencies respectively) to the transmission front-end circuit 112 so that the transmission front-end circuit 112 can generate the transmission analog signal according to the test signal in the first mode and the second mode.

Please refer to FIG. 1. The estimation circuit 136 is configured to carry out the following steps: generating a first estimation signal according to the difference between the test signal and the reception digital signal passing the standard path in the first mode; generating a second estimation signal according to the difference between the test signal and the reception digital signal passing the leakage path in the second mode; and determining N coefficient(s) of a calibration filter (e.g., a finite impulse response (FIR) filter having N tap(s)) according to the difference between the first estimation signal and the second estimation signal, in which the N is a positive integer. The calibration signal generator 138 includes the calibration filter (e.g., the calibration filter 1382 of FIG. 2) and an equivalent transmission front-end circuit (e.g., the equivalent transmission front-end circuit 1384 of FIG. 2) including a circuit equivalent to the transmission front-end circuit 112 and a mixer equivalent to the transmission mixer 222 described in the later paragraph. The calibration signal generator 138 is configured to provide a calibration signal (e.g., a signal equivalent/similar to an inverse signal of the signal leakage originated from the transmission radio frequency circuit) for the reception circuit 120 according to a source signal (e.g., the output signal of the transmission baseband circuit 252 of FIG. 2) in the operation mode. Since the coefficient(s) of the calibration filter of the calibration signal generator 138 is determined according to the difference between the standard path and the leakage path, with the functions of the calibration filter and the equivalent transmission front-end circuit, the calibration signal generator 138 is capable of generating the calibration signal for offsetting at least a part of the signal leakage originated from the transmission radio frequency circuit.

Based on the above description, in an embodiment of the present invention, the first estimation signal includes a first estimated signal amplitude change and a first estimated signal phase angle change and the second estimation signal includes a second estimated signal amplitude change and a second estimated signal phase angle change. If the test signal is composed of (or includes) a plurality of single tone signals separated by a predetermined frequency interval (e.g., an adjustable/fixed/inconstant frequency interval), which means that the frequency interval between two adjacent single tone signals is predetermined, the first/second estimated signal amplitude change includes amplitude changes related to the frequencies of all the single tone signals respectively and the first/second estimated signal phase angle change includes phase angle changes related to the frequencies of all the single tone signals respectively; therefore, the amplitude and phase angle difference between the first estimation signal and the second estimation signal (which is called the frequency response value of estimation signals hereafter) related to the frequency of each single tone signal can be obtained. The frequency response value of estimation signals can be converted into one or more time domain coefficients used for determining the aforementioned N coefficient(s) of the calibration filter. For instance, providing the test signal is composed of k single tone signals separated by a predetermined frequency interval, the steps for obtaining the coefficient(s) of the calibration filter are as follows:

(1) determining k complex matrixes equivalent to k leakages, in which each matrix is named M(K) while K is one of 0, 1, 2, 3, . . . , and (k−1). More specifically, since the k single tone signals are associated with k different frequencies ($w_0, w_1, w_2, \ldots, w_{k-2}, w_{k-1}$) respectively, if an FIR filter having n coefficient(s) (i.e., n taps) is used to process each single tone signal, k frequency response matrixes can be obtained; and if the matrix M(K) is converted from the form of frequency domain to the form of time domain, the converted matrix is named m(K).

(2) multiplying M(k) by the frequency response matrix H of a transmission path (i.e., M(K)×H), and then having the value(s) in the result of the multiplication standing for the amplitude and phase angle changes be zero, in which M(K) is equal to $$\frac{1}{H} \times e^{-jw_K\tau}\left(M(K) = \frac{1}{H} \times e^{-jw_K\tau}, K = 0, 1, 2, 3 \ldots, k-1\right),$$

$w_K$ (i.e., one of $w_0, w_1, w_2, \ldots, w_{k-2}$, and $w_{k-1}$) is the frequency of one of the k single tone signals, and $\tau$ is a constant delay coefficient (e.g., the equivalent delay coefficient of the said transmission path and/or the delay coefficient of the aforementioned calibration filter).

(3) comparing the frequency response of the leakage path with the frequency response of the standard path and then obtaining the complex frequency responses of the k single tone signals as shown below:

$$M=[e^{-jw_0}, e^{-jw_1}, \ldots, e^{-jw_{k-1}}], M=\{M(K)\}$$

(4) deriving the time domain coefficient(s) from the complex frequency responses.

(5) Since the spectrum response of each frequency (i.e., each of the frequencies $w_0, w_1, \ldots, w_{k-1}$ of the k single tone signals) is obtained by the FIR filter with n taps doing transformation as shown in the following equation:

$$(e^{jwT}) = \sum_{n=-\infty}^{\infty} x(n)e^{-jwT_n}$$

$$W = \begin{bmatrix} e^{-jw_0(0)} & e^{-jw_1(0)} & \ldots & e^{-jw_{k-1}(0)} \\ e^{-jw_0(1)} & e^{-jw_1(1)} & \ldots & e^{-jw_{k-1}(1)} \\ & & \vdots & \\ e^{-jw_0(n-1)} & e^{-jw_1(n-1)} & \ldots & e^{-jw_{k-1}(n-1)} \end{bmatrix},$$

the following equation can be obtained accordingly:

$$M(K) = m(K) \times W$$

$$k \text{ leakages} = [m(0), m(1), \ldots, m(k-1)] = M \times \frac{WH}{W \times WH}$$

Therefore, the result of the above equation can be treated as the coefficient(s) of the FIR filter that is designed to offset the leakage originated from the leakage path.

Figure 2:
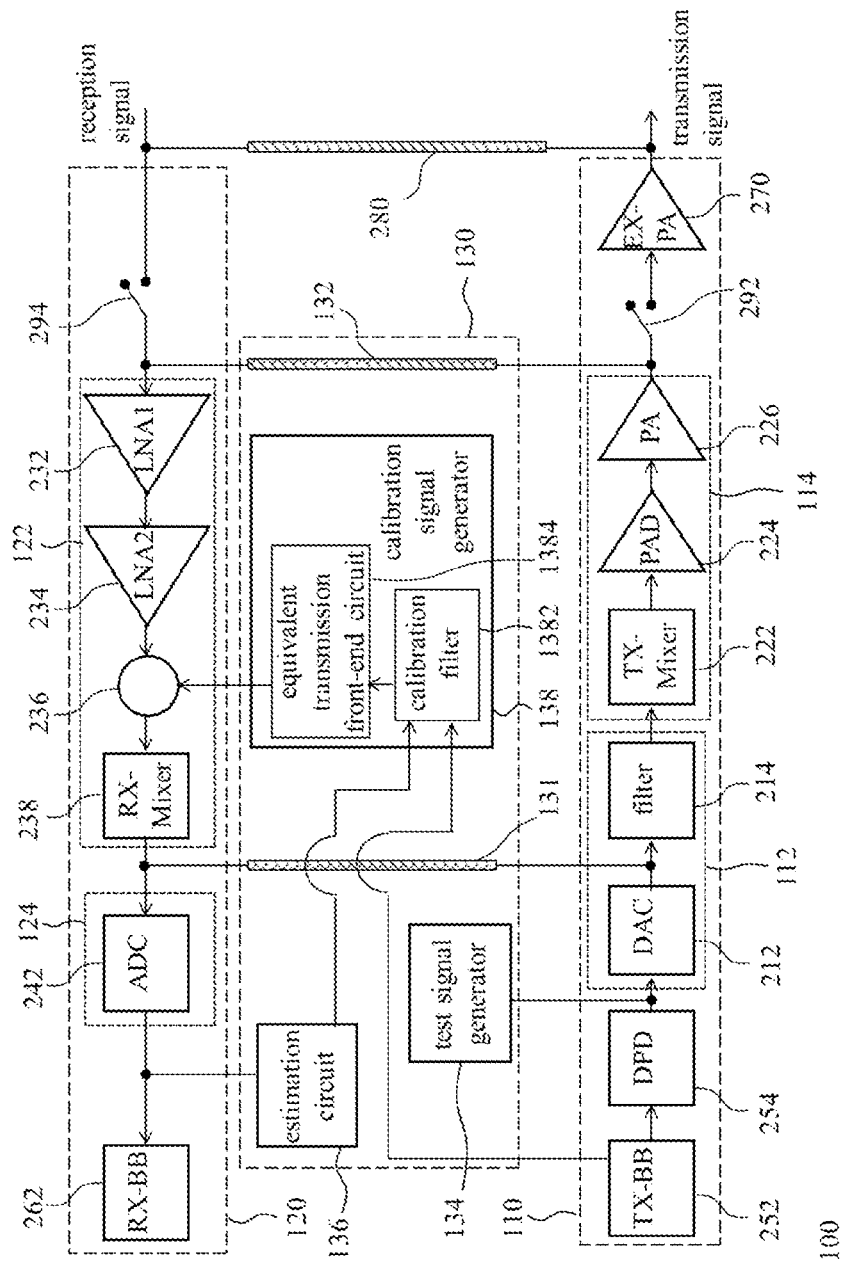
FIG. 2 shows an exemplary implementation of the wireless transceiver of FIG. 1.

FIG. 2 shows an exemplary implementation of the wireless transceiver 100 of FIG. 1. As shown in FIG. 2, the transmission front-end circuit 112 includes a DAC 212 and a filter 214, in which the filter 214 is configured to generate a transmission filtered signal according to the aforementioned transmission analog signal so that the aforementioned transmission radio frequency circuit generates the radio frequency transmission signal according to the transmission filtered signal. The transmission back-end circuit 114 includes a transmission mixer 222 labeled with "TX-Mixer" in the figure, a preamplifier driver (PAD) 224, and a power amplifier 226 labeled with "PA" in the figure. The reception front-end circuit 122 includes at least one low noise amplifier (e.g., the first low noise amplifier 232 labeled with "LNA1" and the second low noise amplifier 234 labeled with "LNA2" in FIG. 2), a coupler 236 (e.g., an adder/subtractor), and a reception mixer 238 labeled with "RX-Mixer" in the figure, in which the coupler 236 is configured to receive the calibration signal in the operation mode and can be relocated at another position (e.g., the position between the reception mixer 238 and the ADC 242 mentioned below) as long as such relocation keeps the whole implementation practicable. The reception back-end circuit 124 includes an ADC 242. It should be noted that in the exemplary implementation of FIG. 2, the signal leakage from the transmission back-end circuit 114 includes: the leakage between the output terminal of the preamplifier driver 224 and each input terminal of the at least one low noise amplifier; the leakage between the output terminal of the preamplifier driver 224 and each output terminal of the at least one low noise amplifier; the leakage between the output terminal of the power amplifier 226 and each input terminal of the at least one low noise amplifier; and the leakage between the output terminal of the power amplifier 226 and each output terminal of the at least one low noise amplifier.

Please refer to FIG. 2. The transmission circuit 110 further includes a transmission baseband circuit 252 labeled with "TX-BB" in the figure and a digital predistortion (DPD) circuit 254. The reception circuit 120 further includes a reception baseband circuit 262 labeled with "RX-BB" in the figure. The reception baseband circuit 262 is configured to process a digital signal. The transmission baseband circuit 252 is configured to output a transmission baseband signal and the DPD circuit 254 is configured to output the aforementioned transmission digital signal according to the transmission baseband signal in the operation mode. Accordingly, the calibration signal generator 138 is operable to output the calibration signal to the reception circuit 120 according to the transmission baseband signal in the operation mode.

Please refer to FIG. 2. The transmission circuit 110 further includes an external power amplifier 270 labeled with "EX-PA" in the figure. The external power amplifier 270 is electrically connected to the power amplifier 226 and the output terminal of the external power amplifier 270 is electrically connected to the output terminal of the reception circuit 120 via an external coupling path 280, in which the output terminal of the external power amplifier 270 here is treated as the output terminal of the transmission circuit 110. FIG. 2 also shows that the transmission circuit 110 includes a transmission switch 292 coupled between the power amplifier 226 and the external power amplifier 270 and the reception circuit 120 includes a reception switch 294 coupled between the first low noise amplifier 232 and the output terminal of the reception circuit 120. Both the transmission switch 292 and the reception switch 294 are turned off in the first mode and the second mode but turned on in the operation mode.

It should be noted that in FIG. 2 except the setting of the transmission switch 292 and the reception switch 294, the transmission circuit 110 with the circuits therein and the reception circuit 120 with the circuits therein are known or self-developed circuits, and therefore their detail is omitted here.

In an exemplary implementation of the present invention, the aforementioned operation mode is a full-duplex mode which allows the transmission circuit 110 and the reception circuit 120 to operate concurrently. In an exemplary implementation of the present invention, the operation frequency of the transmission front-end circuit 112 is lower than the operation frequency of the transmission back-end circuit 114, and the operation frequency of the reception front-end circuit 122 is higher than the operation frequency of the reception back-end circuit 124; since signal leakage usually occurs in a high frequency circuit, the aforementioned standard path could be a path including no high frequency circuits while the aforementioned leakage path could be a path including one or more high frequency circuits, and thus the difference between a signal passing through the standard path and a signal passing through the leakage path can reflect the extent of signal leakage. In an exemplary implementation of the present invention, both the transmission signal and the reception signal have the same carrier frequency in the same operation frequency band. In an exemplary implementation of the present invention, the bandwidth of the above-mentioned operation frequency band is not narrower than 40 MHz.

Please refer to FIG. 2. In order to make sure of the effect of offsetting internal signal leakage, the estimation circuit 136 may additionally carry out the following steps:

Step 1: obtaining a present frequency response (i.e., the aforementioned frequency response value of estimation signals) according to the difference between the first estimation signal and the second estimation signal and thereby deriving a frequency response difference between the present frequency response and a previous frequency response, in which the previous frequency response can be obtained by the conversion of a previously calculated time domain coefficient or equal to an available frequency response value that was calculated and stored before. The way to obtain the available frequency response value is the same as the way to obtain the frequency response value of estimation signals. The previously calculated time domain coefficient is obtained by the conversion of the available frequency response from frequency domain to time domain, and such kind of conversion is common in this industrial field. Step 1 is negligible optionally.

Step 2: obtaining a leakage-offset energy according to the reception digital signal with a power spectrum density (PSD) function in the operation mode. The utilization of the PSD function alone is known in this industrial field.

Step 3: adjusting a delay coefficient according to the leakage-offset energy to reduce the following leakage-offset energy (i.e., the leakage-offset energy obtained later) and optionally reduce the following frequency response difference (i.e., the frequency response difference obtained later), in which the delay coefficient relates to a delay difference between the transmission of a source signal via the calibration signal generator 138 and the transmission of the same source signal via the external coupling path 280. In other words, with the adjustment of the delay coefficient, the time difference between the output signal of the transmission baseband circuit 252 arriving the coupler 236 via the calibration signal generator 138 and the output signal of the transmission baseband circuit 252 arriving the coupler 236 via the external coupling path 280 can be decreased. For instance, the delay coefficient is the coefficient of at least one delay circuit in the aforementioned calibration filter.

Step 4: repeating Steps 1~3 M time(s) until a predetermined condition (e.g., the leakage-offset energy is less than a predetermined energy threshold and/or the frequency response difference is less than a predetermined difference threshold) is satisfied, in which the M is an integer not less than zero.

Please refer to FIG. 2. The calibration signal generator 138 includes a calibration filter 1382 and an equivalent transmission front-end circuit 1384 whose functions and effects are described in the preceding paragraphs. Since each of the calibration filter 1382 and the equivalent transmission front-end circuit 1384 alone is a known or self-developed circuit, their detail is omitted here.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the wireless transceiver of the present invention is capable of offsetting internal signal leakage and operable to optionally obtain the leakage-offset energy with the PSD function for making further adjustment according to the leakage-offset energy.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A wireless transceiver capable of offsetting internal signal leakage, comprising:
   a transmission circuit including:
      a transmission front-end circuit including a digital-to-analog converter configured to generate a transmission analog signal according to a transmission digital signal; and
      a transmission back-end circuit including a transmission radio frequency circuit configured to generate a radio frequency transmission signal according to the transmission analog signal;
   a reception circuit including:
      a reception front-end circuit including a reception radio frequency circuit, the reception radio frequency circuit configured to generate a reception analog signal according to the radio frequency transmission signal in a first mode and a second mode and configured to generate the reception analog signal according to a reception signal and a transmission signal in an operation mode, in which the reception analog signal includes signal leakage from the transmission radio frequency circuit and the transmission signal is the radio frequency transmission signal or an amplified signal of the radio frequency transmission signal; and
      a reception back-end circuit including an analog-to-digital converter configured to generate a reception digital signal according to the reception analog signal; and
   a calibration circuit including:
      a first connection path configured to be electrically conductive in the first mode and nonconductive in the second mode so that the first connection path electrically connects the transmission front-end circuit and the reception back-end circuit in the first mode to form a standard path including the transmission front-end circuit, the first connection path, and the reception back-end circuit;
      a second connection path configured to be electrically conductive in the second mode and nonconductive in the first mode so that the second connection path electrically connects the transmission back-end circuit and the reception front-end circuit in the second mode to form a leakage path including the transmission front-end circuit, the transmission back-end circuit, the second connection path, the reception front-end circuit, and the reception back-end circuit;

a test signal generator configured to output a test signal to the transmission front-end circuit in the first mode and the second mode to allow the transmission front-end circuit to generate the transmission analog signal according to the test signal in the first mode and the second mode;

an estimation circuit configured to carry out at least following steps:
  generating a first estimation signal according to a first difference between the test signal and the reception digital signal passing the standard path in the first mode;
  generating a second estimation signal according to a second difference between the test signal and the reception digital signal passing the leakage path in the second mode; and
  determining N coefficient(s) of a calibration filter according to a difference between the first estimation signal and the second estimation signal, in which the N is a positive integer; and a calibration signal generator including the calibration filter, the calibration signal generator configured to provide a calibration signal for the reception circuit in the operation mode to offset at least a part of the signal leakage from the transmission radio frequency circuit.

2. The wireless transceiver of claim 1, wherein the operation mode is a full-duplex mode.

3. The wireless transceiver of claim 1, wherein an operation frequency of the transmission front-end circuit is lower than an operation frequency of the transmission back-end circuit, and an operation frequency of the reception front-end circuit is higher than an operation frequency of the reception back-end circuit.

4. The wireless transceiver of claim 1, wherein the transmission front-end circuit includes a filter configured to generate a transmission filtered signal according to the transmission analog signal so that the transmission radio frequency circuit generates the radio frequency transmission signal according to the transmission filtered signal.

5. The wireless transceiver of claim 1, wherein the transmission back-end circuit includes a transmission mixer, a preamplifier driver (PAD), and a power amplifier, the reception front-end circuit includes at least one low noise amplifier, a coupler, and a reception mixer, and the coupler is configured to receive the calibration signal in the operation mode.

6. The wireless transceiver of claim 5, wherein the signal leakage from the transmission radio frequency circuit includes: leakage between an output terminal of the preamplifier driver and each input terminal of the at least one low noise amplifier; leakage between the output terminal of the preamplifier driver and each output terminal of the at least one low noise amplifier; leakage between an output terminal of the power amplifier and each input terminal of the at least one low noise amplifier; and leakage between the output terminal of the power amplifier and each output terminal of the at least one low noise amplifier.

7. The wireless transceiver of claim 5, wherein the transmission circuit further includes an external power amplifier electrically connected with the power amplifier while an output terminal of the external power amplifier is electrically connected with an output terminal of the reception circuit via an external coupling path.

8. The wireless transceiver of claim 7, wherein the transmission circuit further includes a transmission switch coupled between the power amplifier and the external power amplifier, the reception circuit further includes a reception switch coupled between the at least one low noise amplifier and the output terminal of the reception circuit, and the transmission switch and the reception switch are turned off in the first mode and the second mode but turned on in the operation mode.

9. The wireless transceiver of claim 7, wherein the estimation circuit further carries out following steps:
  obtaining a present frequency response according to the difference between the first estimation signal and the second estimation signal and thereby deriving a frequency response difference between the present frequency response and a previous frequency response;
  obtaining a leakage-offset energy according to the reception digital signal with a power spectrum density (PSD) function in the operation mode; and
  adjusting a delay coefficient according to the leakage-offset energy to reduce a following frequency response difference and a following leakage-offset energy, in which the delay coefficient relates to a delay difference between signal transmission via the calibration signal generator and signal transmission via the external coupling path.

10. The wireless transceiver of claim 1, wherein the test signal includes a plurality of single tone signals separated by a predetermined frequency interval.

11. The wireless transceiver of claim 10, wherein the predetermined frequency interval is adjustable.

12. The wireless transceiver of claim 10, wherein the predetermined frequency interval is a fixed frequency internal.

13. The wireless transceiver of claim 1, wherein the first estimation signal includes a first estimated signal amplitude change and a first estimated signal phase angle change, and the second estimation signal includes a second estimated signal amplitude change and a second estimated signal phase angle change.

14. The wireless transceiver of claim 1, wherein the estimation circuit further carries out following steps:
  obtaining a present frequency response according to the difference between the first estimation signal and the second estimation signal and thereby deriving a frequency response difference between the present frequency response and a previous frequency response;
  obtaining a leakage-offset energy according to the reception digital signal with a power spectrum density function in the operation mode; and
  adjusting a delay coefficient according to the leakage-offset energy to reduce a following frequency response difference and a following leakage-offset energy, in which the delay coefficient relates to a transmission delay between signal transmission via the calibration signal generator and signal transmission via an external coupling path while the external coupling path electrically connects an output terminal of the transmission circuit and an output terminal of the reception circuit.

15. The wireless transceiver of claim 1, wherein the estimation circuit further carries out following steps:
  obtaining a leakage-offset energy according to the reception digital signal with a power spectrum density function; and
  adjusting a delay coefficient according to the leakage-offset energy to reduce a following leakage-offset energy, in which the delay coefficient relates to a delay difference between signal transmission via the calibration signal generator and signal transmission via an external coupling path while the external coupling path electrically connects an output terminal of the transmission circuit and an output terminal of the reception circuit.

16. The wireless transceiver of claim 1, wherein the transmission front-end circuit further includes a transmission baseband circuit and a digital predistortion circuit, the transmission baseband circuit is configured to output a transmission baseband signal, the digital predistortion circuit is configured to output the transmission digital signal according to the transmission baseband signal in the operation mode, and the calibration signal generator is configured to output the calibration signal to the reception circuit according to the transmission baseband signal in the operation mode.

17. The wireless transceiver of claim 1, wherein the transmission circuit further includes a transmission switch coupled between the transmission back-end circuit and an external power amplifier, the reception circuit further includes a reception switch coupled between the reception front-end circuit and an output terminal of the reception circuit, the transmission switch and the reception switch are turned off in the first mode and the second mode but turned on in the operation mode, an external coupling path electrically connects an output terminal of the transmission circuit and the output terminal of the reception circuit, and an output terminal of the external power amplifier is the output terminal of the transmission circuit.

18. The wireless transceiver of claim 1, wherein both the transmission signal and the reception signal have a same carrier frequency in a same operation frequency band.

* * * * *